(12) United States Patent
Ha et al.

(10) Patent No.: US 9,526,169 B2
(45) Date of Patent: Dec. 20, 2016

(54) PRINTED CIRCUIT BOARD AND METHOD FOR MANUFACTURING THE SAME

(71) Applicant: Samsung Electro-Mechanics Co., Ltd., Suwon-si (KR)

(72) Inventors: Hyung Gi Ha, Daejeon (KR); Jae Won Jung, Daegu (KR); Yong Hwan Kim, Chungcheongnam-do (KR); Jong Jin Lee, Daejeon (KR); Ja Ho Koo, Daegu (KR); Young Hwan Shin, Daejeon (KR); Dong Kyu Lee, Daegu (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/849,122

(22) Filed: Sep. 9, 2015

(65) Prior Publication Data

US 2015/0382461 A1 Dec. 31, 2015

Related U.S. Application Data

(62) Division of application No. 13/308,439, filed on Nov. 30, 2011, now Pat. No. 9,161,460.

(30) Foreign Application Priority Data

Dec. 29, 2010 (KR) .................. 10-2010-0138241

(51) Int. Cl.
*H05K 1/09* (2006.01)
*H05K 1/11* (2006.01)
(Continued)

(52) U.S. Cl.
CPC .............. *H05K 1/09* (2013.01); *H05K 1/0284* (2013.01); *H05K 1/11* (2013.01); *H05K 3/383* (2013.01);
(Continued)

(58) Field of Classification Search
CPC .......... H05K 1/09; H05K 1/0284; H05K 1/11; H05K 3/462; H05K 3/385; H05K 3/383; H05K 2201/0129; H05K 2201/0195; H05K 2201/023; H05K 2201/0239; H05K 3/321; H05K 1/0213; H05K 1/0216; H05K 1/0218; H05K 1/0219; H05K 1/0224; H05K 1/0227; H05K 1/0228; H05K 1/0236; H05K 1/0237; H05K 1/0239; H05K 1/024; H05K 1/0242; H05K 1/0245; H05K 1/0246; H05K 1/0248; H05K 1/025; H05K 1/0256; H05K 1/0257; H05K 1/0259; H05K 1/026; H05K 1/0263; H05K 1/0265; H05K 1/0278; H05K 1/0296; H05K 1/0298; H05K 1/036; H05K 1/0366; H05K 1/0373; H05K 1/0393; H05K 1/05; H05K 1/111
See application file for complete search history.

(56) References Cited

U.S. PATENT DOCUMENTS 4,661,417 A 4/1987 Suzuki et al.
4,867,839 A 9/1989 Sato et al.
(Continued)

FOREIGN PATENT DOCUMENTS

JP 2003-008199 A 1/2003

*Primary Examiner* — Ishwarbhai B Patel
(74) *Attorney, Agent, or Firm* — NSIP Law

(57) ABSTRACT

Disclosed herein are a printed circuit board and a method for manufacturing the same. The printed circuit board includes: a base substrate having a metal pattern for a circuit; and a surface roughness provided on the metal pattern, wherein the surface roughness has a first surface roughness in an anchor structure and a second surface roughness having a black oxide layer in a granular structure formed on the first surface roughness.

3 Claims, 6 Drawing Sheets

(51) Int. Cl.
*H05K 1/02* (2006.01)
*H05K 3/38* (2006.01)
*H05K 3/46* (2006.01)

(52) U.S. Cl.
CPC .............. *H05K 3/385* (2013.01); *H05K 3/462* (2013.01); *H05K 2201/0195* (2013.01); *H05K 2201/0239* (2013.01)

(56) References Cited

U.S. PATENT DOCUMENTS

| | | |
|---|---|---|
| 4,970,107 A | 11/1990 | Akahoshi et al. |
| 5,861,076 A * | 1/1999 | Adlam ................ B32B 37/0038 148/272 |
| 6,475,638 B1 | 11/2002 | Mitsuhashi et al. |
| 7,291,915 B2 | 11/2007 | Sugawa et al. |
| 7,453,702 B2 | 11/2008 | Tsukada et al. |
| 8,568,867 B2 * | 10/2013 | Chan .................. C08G 73/1007 428/323 |
| 2004/0151883 A1 | 8/2004 | Higashitani |
| 2008/0264684 A1 | 10/2008 | Kang et al. |

* cited by examiner (a)  (b)

(a)  (b)

(c)

PRINTED CIRCUIT BOARD AND METHOD FOR MANUFACTURING THE SAME

CROSS REFERENCE TO RELATED APPLICATION

This application is a Divisional Application of U.S. application Ser. No. 13/308,439, filed Nov. 30, 2011, which claims the benefit under 35 U.S.C. §119(a) of Korean Patent Application No. 10-2010-0138241, filed Dec. 29, 2010, in the Korean Intellectual Property Office, the disclosures of both of which are incorporated herein by reference for all purposes.

BACKGROUND OF THE INVENTION

1. Technical Field

The present invention relates to a printed circuit board and a method for manufacturing the same.

2. Description of the Related Art

Technical development for size and weight reduction, and thinner and simpler configuration of an electronic apparatus such as a laptop computer, a net-book, a tablet PC, a smart phone, a navigator, and the like has remarkably increased. Technologies for size and weight reduction, and thinner and simpler configuration of an electronic apparatus require not only techniques of decreasing the size of electronic components mounted on the electronic apparatus and micro-processing the same but also design techniques for optimizing a mounting space. Especially, a printed circuit board enabling high density and high integration mounting of electronic components thereon is essentially demanded.

Single-sided printed circuit boards, double-sided printed boards and multilayer printed circuit boards are currently manufactured and available on the market.

The multilayer printed circuit board is configured by laminating a plurality of single-sided boards wherein a specific conductive material is embedded in an internal layer to increase a mounting density of electronic components while improving variation in electrical characteristics, thus being preferably employed.

For production of a multilayer printed circuit board ('PCB'), in order to protect internal circuits against surrounding conditions and maximize interlayer adhesion during lamination to combine respective internal and external layers, thus securing the reliability of the PCB, a variety of surface treatment processes have been conducted.

FIG. 1 is a schematic view illustrating a surface of an internal circuit surface-treated by a conventional brown oxide treatment method through acid type etching.

Referring to FIG. 1A, a PCB 10 has copper (Cu) patterns 12 as an internal circuit formed on both sides of an insulating layer 11. When the Cu patterns 12 are surface treated by brown oxide treatment, an anchor type surface roughness 12a and an organic layer 13 are formed on a surface of the Cu patterns 12, as shown in FIG. 1B.

FIG. 2 is a schematic view illustrating a surface of an internal circuit surface-treated by a conventional alkali reduction type black oxide treatment process.

Referring to FIG. 2A, a PCB 20 has Cu patterns 22 as an internal circuit formed on both sides of an insulating layer 21. When the Cu patterns 22 are surface treated by black oxide treatment using an oxidizing agent and an alkali material, a black oxide layer 23 in a needle structure containing Cu(II) oxide and Cu(I) oxide is formed on a surface of the surface-treated Cu patterns 22a, as shown in FIG. 2B. Moreover, as shown in FIG. 2C, a post-dipping process using a reducing agent and an alkali material is carried out to enable reduction of a surface of the black oxide layer 23 while maintaining the needle structure thereof, thereby forming a Cu reduction layer 24.

FIG. 3 is a schematic view illustrating a surface of an internal circuit surface-treated by a conventional black oxide treatment method through acid dissolution.

Referring to FIG. 3A, a PCB 30 has Cu patterns 32 as an internal circuit formed on both sides of an insulating layer 31. When the Cu patterns 32 are surface treated by a black oxide treatment method, a black oxide layer 33 in a needle structure containing Cu(II) oxide and Cu(I) oxide is formed on a surface of the surface-treated Cu patterns 32a, as shown in FIG. 3B. Moreover, as shown in FIG. 3C, a post-dipping process using an acidic dissolving agent is carried out to form a Cu(I) oxide layer 34 wherein a needle structure is converted into a micro-granular structure.

For products manufactured by the foregoing surface treatment processes, an epoxy based interlayer bonding resin (often referred to as 'prepreg') having a low glass transition temperature Tg (less than 140° C.) and a high resin impregnation rate has generally been used.

However, with the rapidly growing technologies in electronics as described above, a high reliability material used for manufacturing an electronic product with high density, high integration, ultrathin film and high economical efficiency is also required.

As for lamination of products treated by a conventional brown oxide treatment or black oxide treatment method, a variety of prepregs having specific characteristics such as a normal Tg (less than about 140° C.), a middle Tg (about 150 to 170° C.), a high Tg (more than about 180° C.), a low dielectric constant (Dk; less than about 4.2), a low dielectric loss (Df; less than about 0.015) and/or halogen-free properties (including antimony-free or red phosphorous-free properties) are generally used. For instance, when a bismaleidotriazine (BT) resin having a Tg of more than 200° C., excellent characteristics such as heat resistance, dielectric properties, insulating properties and/or migration-resistance, and favorable activity under molding conditions is used as a prepreg for manufacturing a semiconductor packaging substrate, the substrate treated by a conventional brown oxide treatment or black oxide treatment method has a peel strength of about 0.2 kgf/cm, which is not suitable for a high reliability product requiring a peel strength of at least 0.4 kgf/cm.

In particular, if a black-oxide treatment process is conducted in a horizontal roll type line, a substrate may have numerous roll marks generated on a surface thereof, which in turn causes Cu exposure, thus causing problems in interlayer adhesion and appearance of a final product.

SUMMARY OF THE INVENTION

The present invention has been made in an effort to provide a surface treatment process for manufacturing a general multilayer printed circuit board (PCB').

Further, the present invention has been made in an effort to provide a method for surface treatment of a circuit to improve interlayer adhesion of a PCB, which includes using a variety of prepregs having a normal Tg, a middle Tg, a high Tg, a low Dk, a low Df and/or excellent halogen-free properties, especially, a BT resin with excellent heat resistance, dielectric properties, insulating properties and migration-resistance, as well as PCBs manufactured by the same.

Further, the present invention has been made in an effort to provide a PCB having minimum roll marks generated during a horizontal roll process, by decreasing a thickness of a black oxide layer, as compared to a conventional black oxide treatment method, as well as a method for manufacturing the same.

According to a preferred embodiment of the present invention, there is provided a printed circuit board (PCB) including: a base substrate having a metal pattern for a circuit; and a surface roughness formed on the metal pattern, wherein the surface roughness has a first surface roughness in an anchor structure and a second surface roughness having a black oxide layer in a needle structure formed on the first surface roughness.

The second surface roughness of the PCB may further include a reduction layer formed by reducing a surface of the black oxide layer.

Preferably, the black oxide layer in a needle structure may have a thickness in the range of 0.05 to 1.0 mg/cm$^2$.

A metal of the metal pattern of a PCB may comprise Cu or a Cu alloy.

According to another preferred embodiment of the present invention, there is provided a printed circuit board (PCB) including: a base substrate having a metal pattern for a circuit; and a surface roughness formed on the metal pattern, wherein the surface roughness includes a first surface roughness in an anchor structure and a second surface roughness having a black oxide layer in a granular structure formed on the first surface roughness.

Preferably, the black oxide layer in a granular structure may have a thickness in the range of 0.005 to 0.4 mg/cm$^2$.

According to another preferred embodiment of the present invention, there is provided a method for manufacturing a printed circuit board (PCB), including: treating a metal surface for a circuit with an etching solution for forming an anchor structure, to form a first surface roughness in an anchor structure on the metal surface; pre-dipping the metal surface having the first surface roughness to activate the same; and subjecting the activated metal surface into a black-oxide treatment to form a second surface roughness having a black oxide layer in a needle structure on the first surface roughness having an anchor structure.

The method may further include degreasing the metal surface for a circuit, before the formation of the first surface roughness.

According to a preferred embodiment of the present invention, the method may further include post-dipping the black-oxide treated metal surface using a basic reducing agent to form a reduction layer, after the formation of the second surface roughness.

According to a preferred embodiment of the present invention, the method may further include post-dipping the black-oxide treated metal surface using an acidic dissolving agent to convert the needle structure of the black oxide layer into a granular structure, after the formation of the second surface roughness.

The etching solution may contain an etchant for forming an anchor structure, which includes an inorganic acid, an organic acid, an oxidizing agent, and an azole compound. Here, a content of the etchant for forming an anchor structure may range from 0.5 to 30 wt. % of the etching solution.

The pre-dipping may be performed using a pre-dipping solution containing, preferably, an organic acid, an inorganic acid, a base and/or an oxidizing agent, alone or in combination of two or more thereof.

The black-oxide treatment may be conducted using a black-oxide treating reaction solution containing, preferably, an oxidizing agent and a base.

The basic reducing agent may be selected from a group consisting of dimethylamine borane (DMAB), morpholine borane (MPB), formalin (HCHO), sodium borohydride (NaBH$_4$), potassium borohydride (KBH$_4$) and mixtures thereof.

The acidic dissolving agent may be selected from a group consisting of an inorganic acid, an organic acid, an oxidizing agent, a persulfate compound, an azole compound, a chelate compound, a surfactant and mixtures thereof.

DESCRIPTION OF THE PREFERRED EMBODIMENTS

Figure 1:
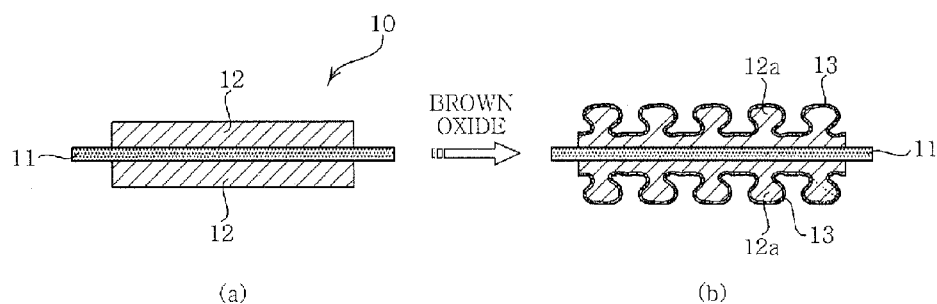
FIG. 1 is a schematic view illustrating a surface of an internal circuit which was surface treated by a conventional brown oxide treatment method through acid type etching.
Figure 2:
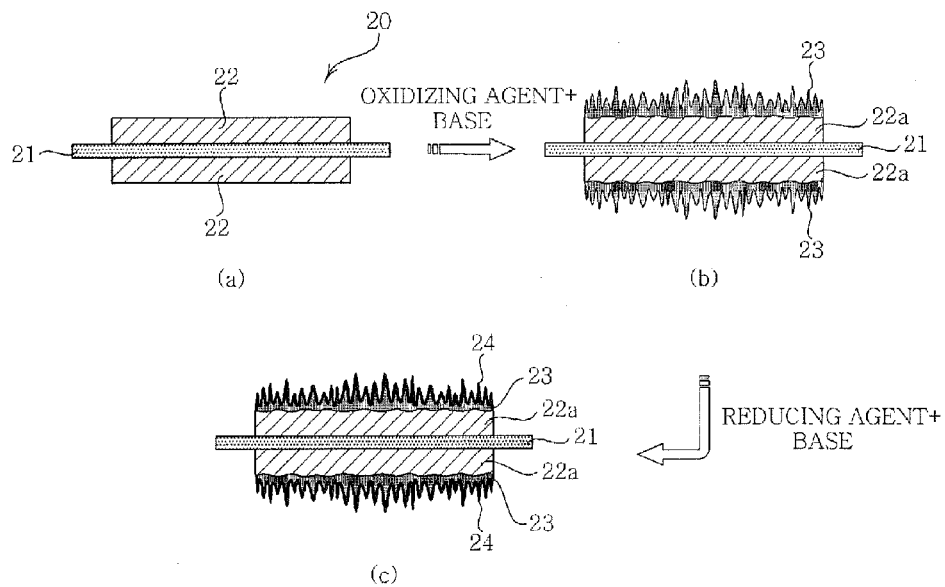
FIG. 2 is a schematic view illustrating a surface of an internal circuit which was surface treated by a conventional basic reduction type black oxide treatment method.
Figure 3:
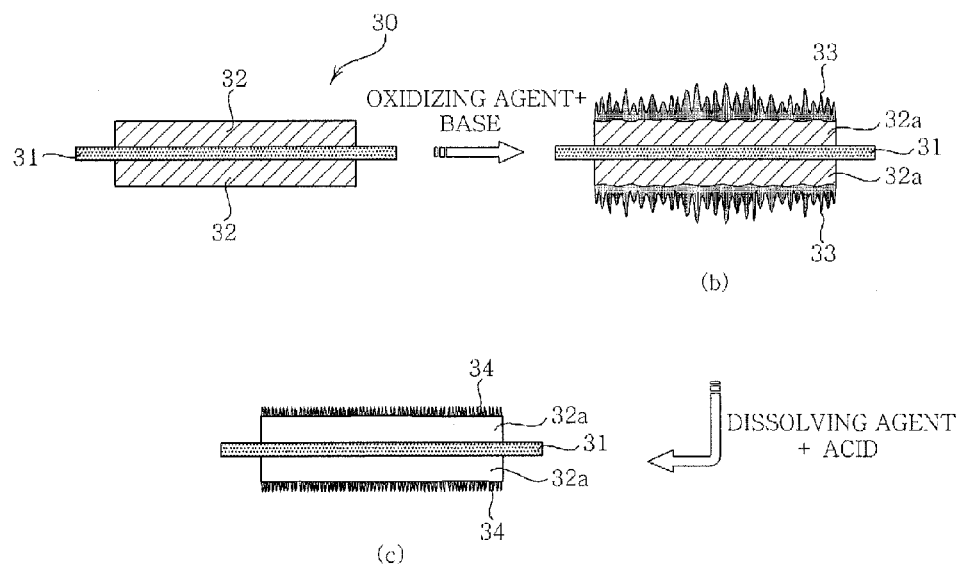
FIG. 3 is a schematic view illustrating a surface of an internal circuit which was surface treated by a conventional acidic dissolution type black oxide treatment method.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Terms used in the specification, 'first', 'second', etc. can be used to describe various components, but the components are not to be construed as being limited to the terms. The terms are only used to differentiate one component from other components.

Printed Circuit Board (PCB)

Figure 4:
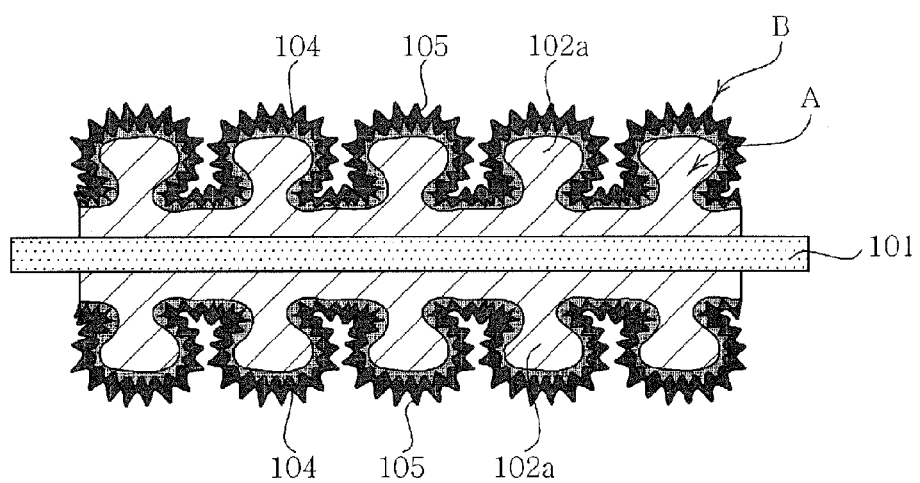
FIG. 4 is a cross-sectional view illustrating a structure of a PCB according to a first preferred embodiment of the present invention.
Figure 5:
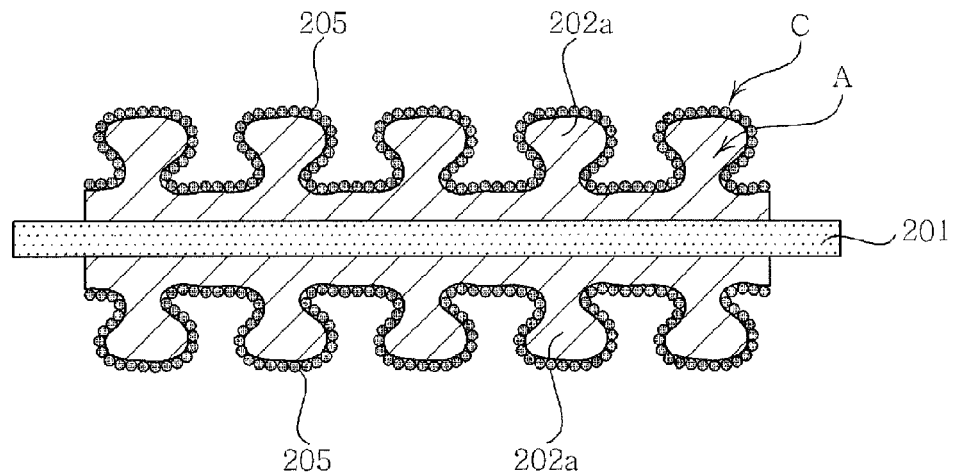
FIG. 5 is a cross-sectional view illustrating a structure of a PCB according to a second preferred embodiment of the present invention.

FIG. 4 is a cross-sectional view illustrating a structure of a PCB according to a first preferred embodiment of the present invention, and FIG. 5 is a cross-sectional view illustrating a structure of a PCB according to a second preferred embodiment of the present invention.

Referring to FIG. 4, the PCB according to the first preferred embodiment of the present invention comprises a base substrate 101 having a metal pattern for a circuit and a surface roughness formed on the metal pattern, wherein the surface roughness includes a first surface roughness 102a in an anchor structure A and a second surface roughness having a black oxide layer 104 in a needle structure B formed on the first surface roughness 102a.

Since the first surface roughness 102a has a macro-anchor structure, interlayer adhesion to a prepreg may be improved. Here, 'macro' means that the surface roughness is formed throughout the width and depth of several micrometers (μm) in an etched region.

Then, by forming a second surface roughness having a black oxide layer 104 in the secondarily formed micro-needle structure B on the first surface roughness 102a, the interlayer adhesion to the prepreg may be further increased.

Meanwhile, a thickness of the black oxide layer 104 may range from 0.05 to 1.0 mg/cm$^2$, more preferably, 0.1 to 0.6 mg/cm$^2$. If this thickness is less than 0.05 mg/cm$^2$, the second surface roughness may be insufficiently formed. On the other hand, if the thickness is more than 1.0 mg/cm$^2$ and too large, roll marks may be generated on the PCB during a horizontal roll process.

The second surface roughness may further include a reduction layer 105 formed by treating a surface of the black oxide layer 104 using a reducing agent containing a base during post-dipping.

The reduction layer 105 is substantially formed by reduction of a CuO layer present on the surface of the black oxide layer structure into a metal Cu layer having favorable acid resistance, while possibly preventing pink-rings from occurring when exposed to acid.

Referring to FIG. 5, the PCB according to the second preferred embodiment of the present invention comprises a base substrate 201 having a metal pattern for a circuit and a surface roughness formed on the metal pattern, wherein the surface roughness includes a first surface roughness 202a in an anchor structure A and a second surface roughness having a black oxide layer 205 in a granular structure C formed on the first surface roughness 202a.

Since the first surface roughness 202a has a macro-anchor structure, interlayer adhesion to a prepreg may be improved. Here, 'macro' means that the surface roughness is formed throughout the width and depth of several micrometers (μm) in an etched region.

Then, by forming a second surface roughness having a black oxide layer 205 in the secondarily formed granular structure C on the first surface roughness 202a, the interlayer adhesion to the prepreg may be further increased.

Here, the second surface roughness is a black oxide layer 205 in a granular structure C formed by treating a surface of the black oxide layer, which has a micro-needle structure formed during black-oxide treatment, using an acidic dissolving agent in the post-dipping process.

Meanwhile, a thickness of the black oxide layer 205 in a granular structure C may range from 0.005 to 0.4 mg/cm$^2$, more preferably, 0.01 to 0.3 mg/cm$^2$. If this thickness is more than the above range, the granular structure of second surface roughness may be poorly formed due to the non-uniform surface, otherwise, failure to prevent a pink-ring may occur due to decreased acid resistance.

The black oxide layer 205 having a micro-granular structure C may be formed by, for example, dissolving CuO present on the surface of the black oxide layer structure and converting the same into $Cu_2O$ having relatively favorable acid resistance, thus efficiently preventing pink rings from occurring when exposed to acid.

The foregoing drawings show the surface roughness in enlarged scale in order to clearly illustrate a surface condition of the metal pattern, however, those skilled in the art will appreciate that such a scale does not correspond to an actual structural ratio of the surface roughness.

Although other detailed components of the PCB except for featured parts of the inventive preferred embodiment are omitted for clarity in the foregoing drawings, it will be apparent to those skilled in the art that a general PCB structure well-known in the art may be applied to the inventive preferred embodiment. In particular, each of the base substrates 101 and 201 may be any conventional multilayer circuit board having at least one circuit layer on an insulating layer.

The multilayer circuit board may include not only a typical PCB consisting of not more than 4 layers but also a multilayer PCB, a ball grid array (BGA) PCB and other PCBs for special use.

In manufacturing a multilayer PCB, the inventive PCB exhibits acid resistance or corrosion resistance during an additional laminating process, thus being preferably used as an internal substrate for the multilayer PCB, however, not being particularly limited thereto. Moreover, the inventive PCB may be used in various applications requiring combination of a PCB with an adhesive resin or a metal layer.

The insulating layer may be prepared using a thermosetting resin such as epoxy resin, a thermoplastic resin such as polyimide, or any other resin that contains not only any of the above resins but also a reinforcing agent such as glass fiber or inorganic filler impregnated therein, such as a prepreg. Thermosetting resin and/or photo-curable resin may also be used. However, the resin used herein is not particularly limited to those described above.

A metal used for the metal pattern for a circuit is not particularly limited so long as it is a conductive metal used for manufacturing a circuit in PCB applications, and may typically include Cu or a Cu alloy.

As described above, the PCB of the present invention has a complex surface roughness comprising a first surface roughness in a macro-anchor structure and a second surface roughness in a micro-needle structure or a micro-granular structure. Therefore, when the inventive PCB is applied to a PCB manufacturing process using a variety of prepregs that have normal Tg, middle Tg, high Tg, low Dk, low Df and/or halogen-free properties, excellent interlayer adhesion may be attained. Especially, even when a BT resin having a relatively low impregnation rate due to a high Tg, as well as a low Dk, is used as the prepreg, excellent interlayer adhesion may be obtained.

Moreover, since the inventive PCB has a complex surface roughness, a thickness of a black oxide layer may be reduced, as compared to a conventional black-oxide treatment process. Accordingly, the present invention may solve a problem in that a black oxide layer in a needle form is crushed by a driven roll during a horizontal process which in turn generates roll marks, if the black oxide layer is thick.

Method for Manufacturing PCB

With regard to a method for manufacturing a PCB, the present inventors have partially changed an oxide treatment method to improve interlayer adhesion by providing a roughness to a metal circuit during surface treatment of a metal surface for a circuit in a process of preparing an internal layer, so as to form a surface roughness in a macro-structure during etching, followed by forming another surface roughness in a micro-structure on the previous surface roughness having the macro-structure by a black-oxide treatment process. Optionally, a post-dipping process was further conducted using a basic reducing agent or an acidic dissolving agent, in order to produce a structure having excellent acid resistance. As a result, it was found that, when this structure having excellent acid resistance was applied to a process for manufacturing a PCB using a variety of prepregs having normal Tg, middle Tg, high Tg, low Dk, low Df and/or halogen-free properties, interlayer adhesion is considerably improved. Especially, it was found that, if a BT resin having a low Dk and a low impregnation rate due to a high Tg is used as the prepreg, excellent adhesive properties such as high interlayer adhesion may be attained. Based on the foregoing findings, the present invention had been completed.

With regard to the inventive method, formation of a surface roughness in a macro-structure means a process of forming a first surface roughness while further formation of a surface roughness in a micro-structure after the formation of the first surface roughness is referred to as a process of forming a second surface roughness.

A method for manufacturing a PCB according to the present invention substantially includes: forming a first surface roughness by treating a metal surface for a circuit of the PCB using an etching solution to provide an anchor structure, so as to form the first surface roughness; activating the first surface roughness by activating the metal surface before black-oxide treatment thereof; and forming a second surface roughness by subjecting the activated metal surface into a black-oxide treatment.

The formation of the surface roughness according to the present invention is substantially completed by the foregoing two-stage process, in particular, combining the macro-structure with the micro-structure to prepare a complex surface roughness. It was found that the resulted surface roughness exhibits unexpected interlayer adhesion to various interlayer bonding resins, that is, prepregs having different characteristics such as normal Tg, middle Tg, high Tg, low Dk, low Df and/or halogen-free properties, as compared to the surface roughness formed in separate stages. Specifically, even when a BT resin having a low Dk and a low impregnation rate due to a high Tg is used as the prepreg, favorable effects such as excellent interlayer adhesion may be obtained.

Furthermore, since the surface roughness is a complex surface roughness formed in two-stages, a thickness of a black oxide layer prepared during a black-oxide treatment process, which is the process of forming the second surface roughness, may be relatively reduced, as compared to a conventional black-oxide treatment process. Therefore, a problem in that a needle type black oxide layer is crushed by a driven roll during a horizontal process which in turn generates roll marks, if the black oxide layer is thick, may be successfully overcome.

The following description will be given to concretely explain preferred embodiments of the present invention, with reference to the accompanying drawings.

Figure 6:
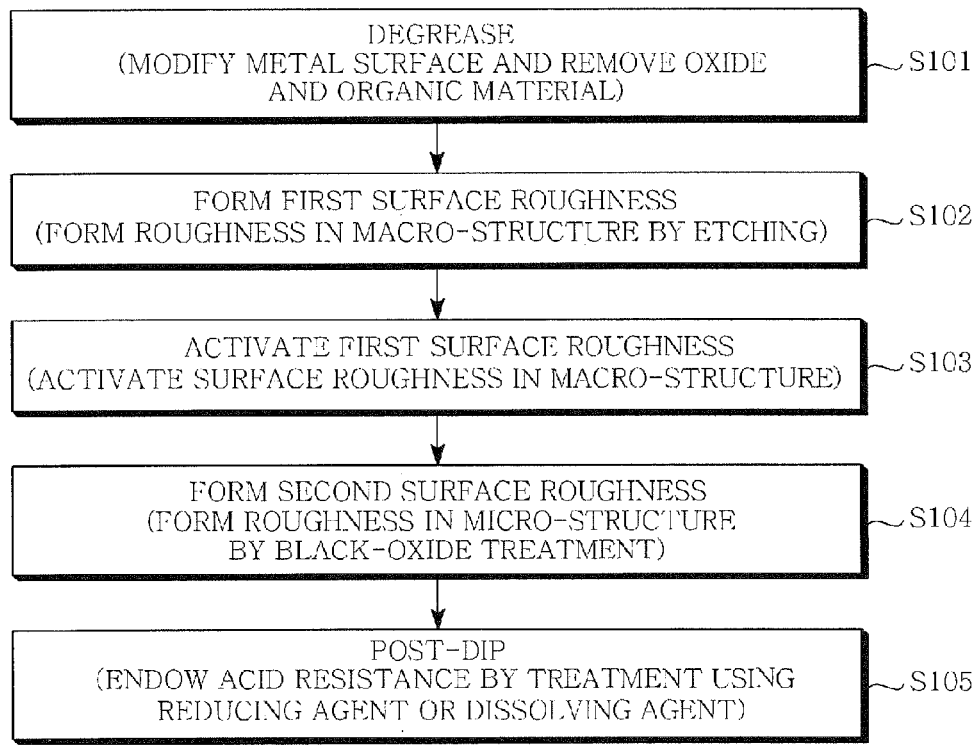
FIG. 6 is a schematic flow chart illustrating a process of manufacturing a PCB according to a preferred embodiment of the present invention.

FIG. 6 is a schematic flow chart illustrating a process of manufacturing a PCB according to a preferred embodiment of the present invention; FIGS. 7 through 11 are schematic flow diagrams illustrating a process of manufacturing a PCB according to the first preferred embodiment of the present invention; and FIG. 12 is a schematic flow diagram illustrating a process of manufacturing a PCB according to the second preferred embodiment of the present invention.

Referring to FIG. 6, the method for manufacturing the PCB as described above comprises: degreasing a metal surface for a circuit of the PCB in operation S101; treating the degreased metal surface for a circuit using an etching solution to provide an anchor structure on the metal surface, thus forming a first surface roughness in operation S102; activating the metal surface before black-oxide treatment thereof, to activate the first surface roughness in operation S103; subjecting the metal surface into a black-oxide treatment to form a second surface roughness in operation S104; and post-dipping the black-oxide treated metal surface using a basic reducing agent or an acidic dissolving agent, after the formation of the second surface roughness, in operation S105.

Hereinafter, referring to FIGS. 7 through 11, the first preferred embodiment of the present invention will be described in detail.

Figure 7:
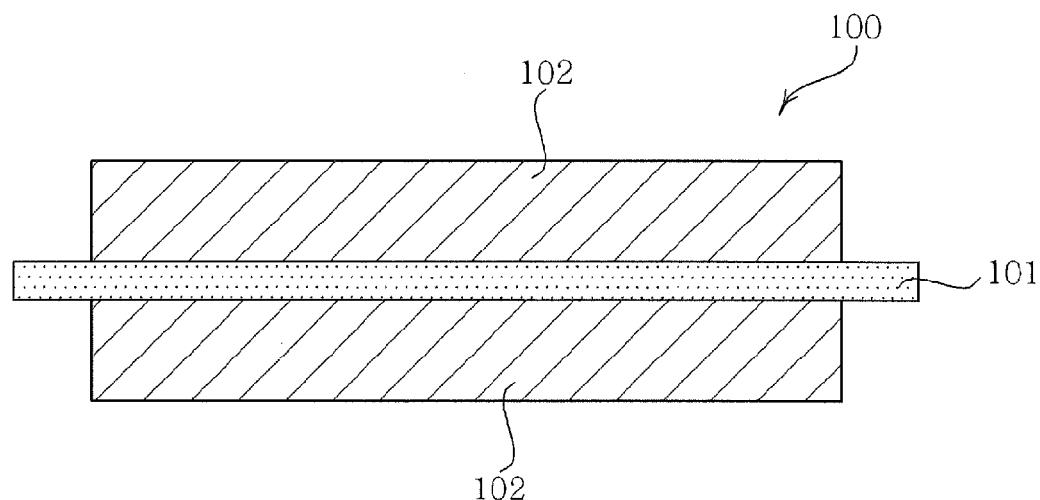
FIGS. 7 to 11 are schematic flow diagrams illustrating a process of manufacturing a PCB according to the first preferred embodiment of the present invention.

First, in FIG. 7, a surface of a circuit metal 102 in a PCB 100 which comprises a base substrate 101 having the circuit metal 102 is subjected to degreasing in order to remove oxide and impurities from the surface. The degreasing of the metal surface for a circuit may be conducted using an acidic or a basic type degreasing solution.

The acidic degreasing solution may contain an inorganic acid, an organic acid, alcohols, a surfactant, or the like.

The inorganic acid may be selected from a group consisting of general inorganic acids such as sulfuric acid, nitric acid, phosphoric acid, hydrochloric acid, fluoric acid, boric acid, carboxylic acid, and the like, and mixtures thereof.

The organic acid may be selected from a group consisting of general organic acids such as glyceric acid, glutaric acid, citric acid, salicyclic acid, adipic acid, ascorbic acid, oxalic acid, maleic acid, malic acid, malonic acid, succinic acid, benzoic acid, glycolic acid, heptanoic acid, tartaric acid, lactic acid, formic acid, propionic acid, acrylic acid, acetic acid, butyric acid, valeric acid, 2-methylbutyric acid, n-hexanoic acid, 3,3-dimethyl butyric acid, 2-ethyl butyric acid, 4-methyl pentanoic acid, n-heptanoic acid, 2-methyl hexanoic acid, n-octanoic acid, 2-ethyl hexanoic acid, pimellic acid, phthalic acid, and the like, and mixtures thereof.

The alcohols may be selected from a group consisting of general alcohols such as ethanol, methanol, isobutyl alcohol, benzyl alcohol, isopropyl alcohol, butanol, pentanol, hexanol, heptanol, octanol, isobutyl alcohol, propanol, diacetone alcohol, isopropyl alcohol, polyvinyl alcohol, propyl alcohol, perfuryl alcohol, diol, 3-chloro-1,2-propane diol, triol, 3-chloro-1-propanediol, 1-chloro-2-propanol, 2-chloro-1-propanol, 3-chloro-1-propanol, 3-bromo-1,2-propanediol, 1-bromo-2-propanol, 3-bromo-1-propanol, 3-iodo-1-propanol, 4-chloro-1-butane, n-butanol, n-pentanol, n-hexanol, 2-chloroethanol, and the like, and mixture thereof.

The surfactant may be selected from a group consisting of cationic, amphoteric, anionic and non-ionic surfactants or mixtures thereof.

The basic degreasing solution may include an amine compound, basic salts, a surfactant, and the like.

The amine compound may be selected from a group consisting of amines such as diethanolamine, triethylamine, triethanolamine, ethylamine, methylamine, hexylamine, isobutylamine, tert-butylamine, tributylamine, dipropylamine, dimethylamine, monoethanolamine, methyl diethanolamine, and the like, and mixtures thereof.

The basic salts may be selected from a group consisting of general basic salts such as sodium hydroxide, potassium hydroxide, sodium silicate, sodium carbonate, and the like, or mixtures thereof.

The surfactant may be selected from cationic, amphoteric and non-ionic surfactants, or mixtures thereof.

In the foregoing drawings, although other detailed components of the PCB except for featured parts of the inventive preferred embodiment are omitted for clarity, it will be apparent to those skilled in the art that a general PCB structure well known in the art may be applied to the inventive method according to the foregoing preferred embodiments. In particular, the base substrate 101 may be any conventional multilayer circuit board having at least one circuit layer on an insulating layer.

A multilayer circuit board applicable to the inventive methods may include not only a typical PCB consisting of not more than 4 layers but also a multilayer PCB, a ball grid array (BGA) PCB and other PCBs for special use.

In manufacturing a multilayer PCB, the inventive PCB exhibits acid resistance or corrosion resistance during an additional laminating process, thus being preferably used in manufacturing the multilayer PCB, however, not being particularly limited thereto. Moreover, the inventive PCB may be used in various applications requiring combination of a PCB with an adhesive resin or a metal layer.

The insulating layer may be prepared using a thermosetting resin such as epoxy resin, a thermoplastic resin such as polyimide, or any other resin that contains any of the above resins and a reinforcing agent such as glass fiber or inorganic filler impregnated therein, such as a prepreg. Thermosetting resin and/or photo-curable resin may also be used. However, the resin used herein is not particularly limited to those described above.

The circuit metal 102 is not particularly limited so long as it is a conductive metal used for manufacturing a circuit in PCB applications, and may typically include Cu or a Cu alloy.

Figure 8:
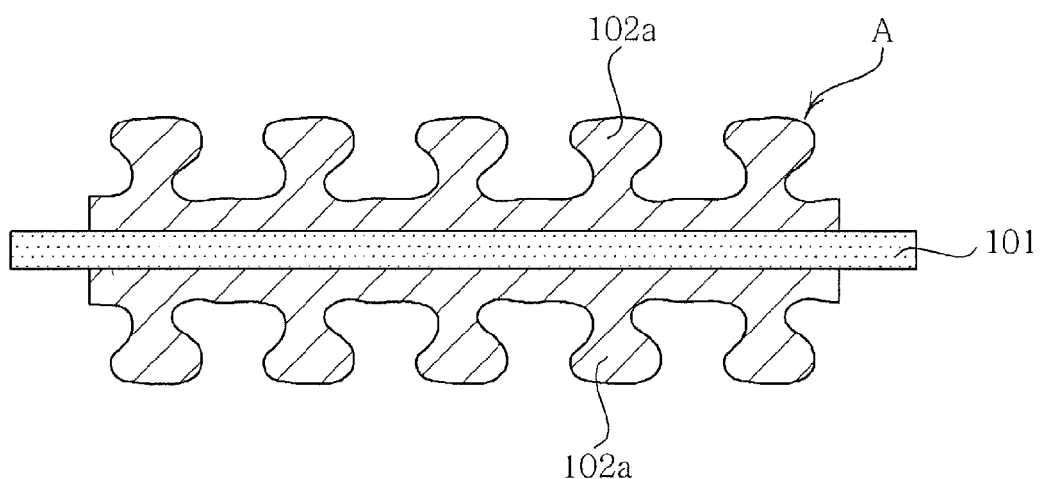

Next, referring to FIG. 8, after degreasing a surface of the circuit metal 102, the degreased surface is subjected to treatment using an etching solution to provide an anchor structure, so as to form a first surface roughness 102a having a macro-anchor structure A on the surface of the circuit metal 102.

The etching solution for forming an anchor structure on a surface of the circuit metal may be a general etchant alone, an etching solution comprising two or more of the general etchant and a specific etchant for forming an anchor structure as a mixture form, a solution of the etchant for forming an anchor structure in deionized water, and/or the etchant for forming an anchor structure alone.

The foregoing etchant may include, for example, a ferrite chloride etchant, a cupric chloride etchant, an alkaline etchant, a hydrogen peroxide and sulfuric acid etchant, a formic acid and cupric chloride etchant, an acetic acid and cupric chloride etchant, a sodium persulfate etchant, a potassium persulfate etchant, an ammonium persulfate etchant, a potassium monosulfate peroxide etchant, a perchlorite etchant, a permanganic acid etchant, a peroxide etchant, a dichromate etchant, and the like.

The etchant for forming an anchor structure may contain an inorganic acid, an organic acid, an oxidizing agent, azole compounds, and the like.

The inorganic acid may be selected from a group consisting of general inorganic acids such as sulfuric acid, nitric acid, phosphoric acid, hydrochloric acid, fluoric acid, boric acid, carboxylic acid, and the like, and mixtures thereof.

The organic acid may be selected from a group consisting of general organic acids such as glyceric acid, glutaric acid, citric acid, salicyclic acid, adipic acid, ascorbic acid, oxalic acid, maleic acid, malic acid, malonic acid, succinic acid, benzoic acid, glycolic acid, heptanoic acid, tartaric acid, lactic acid, formic acid, propionic acid, acrylic acid, acetic acid, butyric acid, valeric acid, 2-methylbutyric acid, n-hexanoic acid, 3,3-dimethyl butyric acid, 2-ethyl butyric acid, 4-methyl pentanoic acid, n-heptanoic acid, 2-methyl hexanoic acid, n-octanoic acid, 2-ethyl hexanoic acid, pimellic acid, phthalic acid, and the like, and mixtures thereof.

The oxidizing agent may be selected from a group consisting of general oxidizing agents such as hydrogen peroxide, urea hydrogen peroxide, percarbonate, benzoyl peroxide, peracetic acid, di-t-butyl peroxide, persulfate, sodium peroxide, periodic acid, periodate, perboric acid, perborate, permanganic acid, permanganate, iodic acid, iodate, cerium ammonium nitrate, ferric nitrate, and the like, or mixtures thereof.

The azole compound may include, for example, imidazole, thiazole, triazole or tetrazole compounds, which are used alone or in combination of two or more thereof.

The imidazole compound may be selected from a group consisting of imidazole, 2-ethylimidazole, 2-methylimidazole, 2-ethyl-4-methylimidazole, 2-phenylimidazole, benzoimidazole, 2-ethylbenzoimidazole, 2-methylbenzoimidazole, 5-methylbenzoimidazole, 2-phenylbenzoimidazole, 2-mercaptobenzoimidazole, 2-isopropylimidazole, 2-propylimidazole, 2-butylimidazole, 4-methylimidazole, 2,4-dimethylimidazole, 2-aminoimidazole, mercatobenzoimidazole, 2-bromobenzyl benziimidazole, 2-chlorobenzyl benziimidazole, 2-bromophenyl benziimidazole, 2-chlorophenyl benziimidazole, 2-bromoethylphenyl benziimidazole, 2-chloroethylphenyl benziimadazole, 2-undecyl-4-methylimidazole, and the like.

The thiazole compound may be selected from a group consisting of thiazole, 2-ethylthiazole, 2,4-dimethylthiazole, 4,5-dimethylthiazole, 2-aminothiazole, 2-amino-2-thiazoline, 2-aminomethylthiazole, 2-amino-4-methylthiazole, 1,2-thiazole, 1,3-thiazole, benzothiazole, 1,2-benzothaizole, 1,3-benzothiazole, 2-aminobenzothiazole, 2-mercaptobenzothiazole, 2-isopropyl-4-methylthiazole, 5-formyl-4-methylthiazole, 5-amino-3H-thiazole, and the like.

The triazole compound may be selected from a group consisting of 1,2,3-triazole, 1,2,4-triazole, 3-amino-1,2,4-triazole, 5-phenyl-1,2,4-triazole, 5-amino-1,2,4-triazole, benzotriazole, sodium benzotriazole, 1-methyl-benzotriazole, tollytriazole, sodium tollytriazole, 4-amino-1,2,4-triazole, 3-amino-5-methyltriazole, 3-amino-5-ethyltriazole, 3,5-diamino-1,2,4-triazole, 3-amino-1,2,4-triazole-5-carboxylic acid, 5-amino-1,2,3,4-thiatriazole, and the like.

The tetrazole compound may be selected from a group consisting of 1H-tetrazole, 5-amino-1H-tetrazole, 5-methyl-H-tetrazole, 5-phenyl-1H-tetrazole, 5-mercapto-1H-tetrazole, 1-phenyl-5-mercapto-1H-tetrazole, 1-methyl-5-aminotetrazole, 1-ethyl-5-aminotetrazole, α-benzyl-5-aminotetrazole, β-benzyl-5-aminotetrazole, 1-(β-aminoethyl)tetrazole, and the like.

Using the etching solution, a first surface roughness 102a in a macro-structure may be formed.

However, the foregoing examples are only described for illustrative purposes and not particularly limited thereto so long as they can form an anchor structure.

The first surface roughness 102a has an anchor structure, thus providing improved interlayer adhesion when adhering to a prepreg.

For formation of the first surface roughness 102a in a macro-structure, the term 'macro' means that the surface roughness is formed throughout the width and depth of several micrometers in an etched region.

A content of the etchant for forming an anchor structure among the etching solution may range from 0.5 to 30 wt. %, more preferably, 1 to 15 wt. %. If the content is less than 0.5 wt. %, the metal surface may be insufficiently etched. If the content exceeds 30 wt. %, the metal surface may be over-etched, thus causing difficulties in the formation of surface roughness. Therefore, a first surface roughness is preferably formed by controlling the content within the foregoing range.

Next, using a pre-dipping solution containing an active ingredient consisting of an organic acid, an inorganic acid, a base and/or an oxidizing agent alone or in combination of two or more thereof, a pre-dipping process may be conducted to activate a surface of the metal circuit before black-oxide treatment.

The inorganic acid used herein may be selected from a group consisting of general inorganic acids such as sulfuric acid, nitric acid, phosphoric acid, fluoric acid, boric acid, carboxylic acid, and the like, or mixtures thereof.

The organic acid used herein may be selected from a group consisting of general organic acids such as glyceric acid, glutaric acid, citric acid, salicyclic acid, adipic acid, ascorbic acid, oxalic acid, maleic acid, malic acid, malonic acid, succinic acid, benzoic acid, glycolic acid, heptanoic acid, tartaric acid, lactic acid, formic acid, propionic acid, acrylic acid, acetic acid, butyric acid, valeric acid, 2-methylbutyric acid, n-hexanoic acid, 3,3-dimethyl butyric acid, 2-ethyl butyric acid, 4-methyl pentanoic acid, n-heptanoic acid, 2-methyl hexanoic acid, n-octanoic acid, 2-ethyl hexanoic acid, pimellic acid, phthalic acid, and the like, or mixtures thereof.

The base used herein may include hydroxide compounds, for example, be selected from a group consisting of general bases such as sodium hydroxide, potassium hydroxide, barium hydroxide, ammonium hydroxide, tetramethylammonium hydroxide, tetraethylammonium hydroxide, and the like, or mixtures thereof.

The oxidizing agent used herein may be selected from a group consisting of general oxidizing agents such as NaClO, $NaClO_2$, $NaClO_3$, KClO, $KClO_2$, $KClO_3$, hydrogen peroxide, urea hydrogen peroxide, and the like, or mixtures thereof.

A content of the active ingredient among the pre-dipping solution may range from 1 to 50 wt. %, more preferably, 5 to 30 wt. %. If the content is less than 1 wt. %, a surface of the circuit metal may not be activated, thus not preventing smooth black-oxide treatment. If the content is more than 50 wt. % and too large, a black-oxide treated structure may be rapidly formed during an additional process, that is, black-oxide treatment, thus decreasing a strength of the structure. Otherwise, the metal surface may be over-etched and cause defects thereon.

Figure 9:
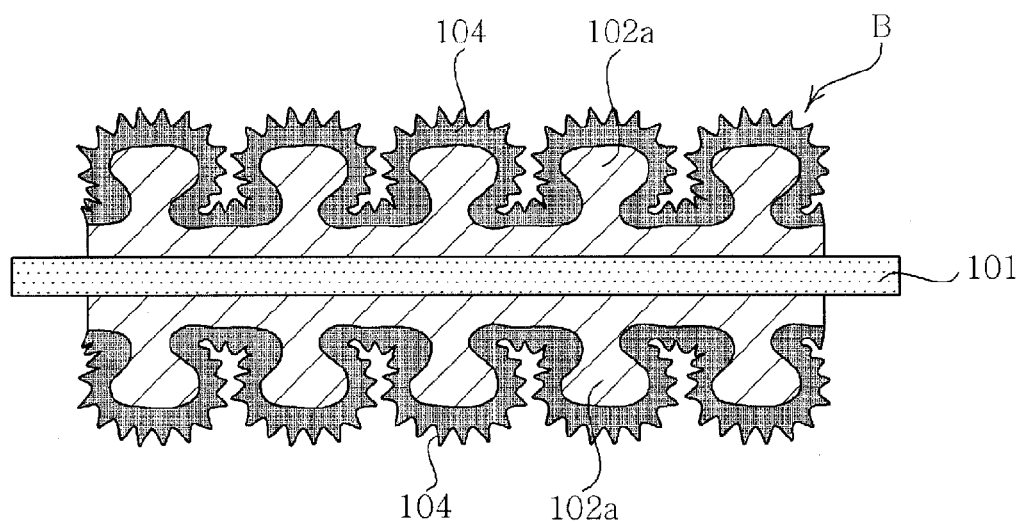

Thereafter, referring to FIG. 9, the metal surface activated by pre-dipping is subjected to black-oxide treatment, so as to form a second surface roughness having a black oxide layer 104 in a needle structure B on the first surface roughness 102a having the anchor structure A.

The black-oxide treatment is preferably performed using a black-oxide treating reaction solution which contains a mixture of an oxidizing agent and a base at 60 to 90° C. for 0.5 to 30 minutes.

The oxidizing agent used herein may be selected from a group consisting of general oxidizing agents such as NaClO, $NaClO_2$, $NaClO_3$, KClO, $KClO_2$, $KClO_3$, and the like, or mixtures thereof.

The base used herein may include hydroxide compounds, for example, be selected from a group consisting of general bases such as sodium hydroxide, potassium hydroxide, barium hydroxide, ammonium hydroxide, tetramethylammonium hydroxide, tetraethylammonium hydroxide, and the like, or mixtures thereof.

A content of the oxidizing agent may range from 1 to 80 wt. %, more preferably, 5 to 60 wt. % relative to a total weight of the black-oxide treating reaction solution. If this content is less than 1 wt. %, a black oxide layer may be insufficiently formed. When the content is more than 80 wt. % and too large, a black-oxide treated structure may be rapidly formed, thus decreasing the strength of the structure.

A content of the base may range from 1 to 60 wt. %, more preferably, 5 to 45 wt. % relative to a total weight of the black-oxide treating reaction solution. If this content is less than 1 wt. %, a black oxide layer may be insufficiently formed. When the content is more than 60 wt. % and is too large, a surface of the PCB may be tinged with red due to an increase in a red $Cu_2O$ layer rather than a black CuO layer. If this layer is not completely removed in an additional washing process due to strong alkaline chemicals, problems may be caused during post-dipping. In addition, since a black-oxide treated structure is rapidly formed, the structure may have decreased strength.

A thickness of the black oxide layer formed during black-oxide treatment according to the present invention may be controlled depending upon a concentration of an oxidizing agent and a base, a temperature and a reaction time. The thickness may range from 0.05 to 1.0 $mg/cm^2$, more preferably, 0.1 to 0.6 $mg/cm^2$. If the thickness is less than 0.05 $mg/cm^2$, the second surface roughness may be insufficiently formed. When the thickness is more than 1.0 $mg/cm^2$ and too large, roll marks may be generated on the PCB during a horizontal roll process. Therefore, the thickness of the black oxide layer is preferably controlled within the foregoing range, so as to improve interlayer adhesion to a prepreg and prevent roll marks during the horizontal roll process.

Figure 10:
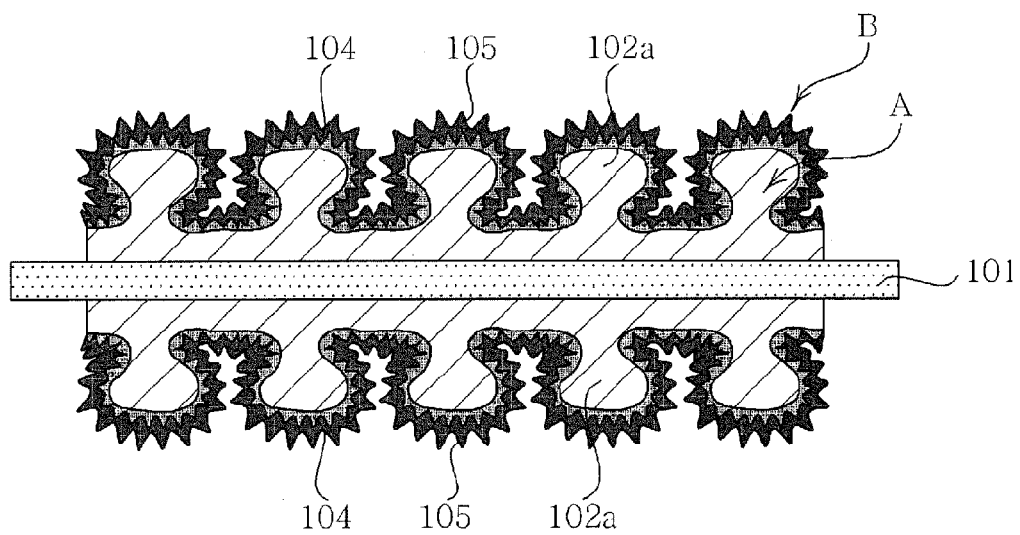

Next, referring to FIG. 10, the black-oxide treated metal surface is subjected to post-dipping to treat the surface using a basic reducing agent containing a base, thereby forming a reduced metal layer 105.

The reduction treatment is a process of converting (reducing) a metal layer provided on a surface of the black-oxide treated structure, for example, a CuO layer into a Cu metal layer having excellent acid resistance. Therefore, similar to a process for manufacturing a multilayer PCB, the reduction process may be conducted if acid resistance is required during an additional process, in order to prevent pink-rings from occurring when exposed to acid.

The basic reducing agent may be selected from a group consisting of dimethylamine borane (DMAB), morpholine borane (MPB), formalin (HCHO), sodium borohydride ($NaBH_4$), potassium borohydride ($KBH_4$) and mixtures thereof, however, is not particularly limited thereto.

The base may be selected from a group consisting of general bases such as sodium hydroxide, potassium hydroxide, barium hydroxide, ammonium hydroxide, tetramethylammonium hydroxide, tetraethylammonium hydroxide, and the like, or mixtures thereof.

The following description will be given to explain a method according to a second preferred embodiment of the present invention with reference to FIG. 12.

With regard to the method of the second preferred embodiment, respective processes for degreasing, formation of a first surface roughness, activation of the first surface roughness and formation of a second surface roughness are substantially the same as described in FIGS. 7 through 9, therefore, a detailed description thereof will be omitted for clarity. Instead, a post-dipping process according to the second preferred embodiment of the present invention will be described below, with reference to FIG. 12.

Referring to FIG. 12, the black-oxide treated metal surface as shown in FIG. 9 is subjected to post-dipping to treat the metal surface using an acidic dissolving agent, thereby forming a black oxide layer 205 in a granular structure C.

The black oxide layer 205 in a granular structure C may have a thickness in the range of 0.005 to 0.4 mg/cm$^2$, more preferably, 0.01 to 0.3 mg/cm$^2$. If this thickness is beyond the above range, a surface roughness in a granular structure may be poorly formed due to non-uniform surface, otherwise, failure in preventing pink-rings occurring due to decreased acid resistance.

The black oxide layer 205 having a micro-granular structure C may be formed by dissolving a metal layer, for example, a CuO layer present on the surface of the black oxide layer structure and converting the same into a Cu$_2$O layer having relatively favorable acid resistance, thus efficiently preventing pink rings from occurring when exposed to acid.

Figure 11:
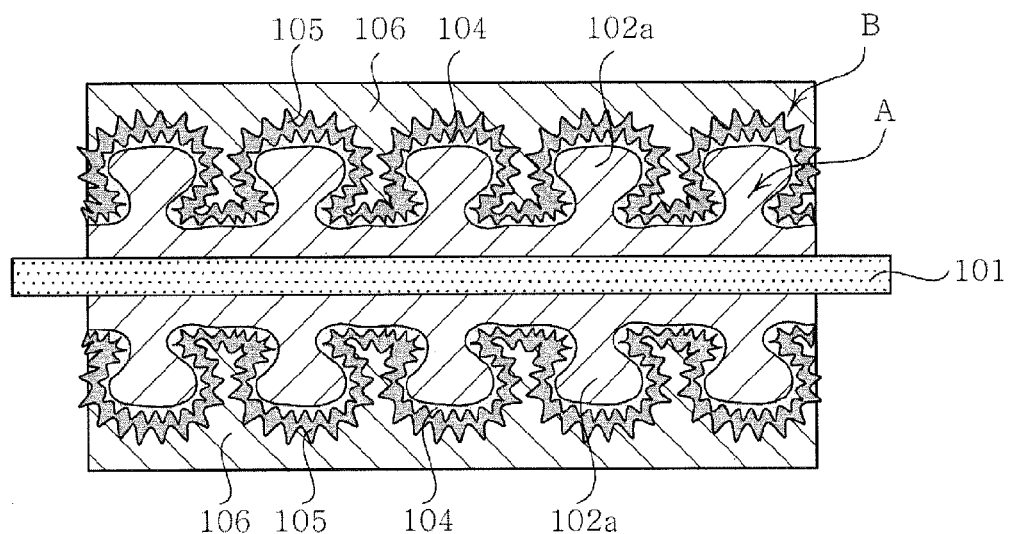
Figure 12:
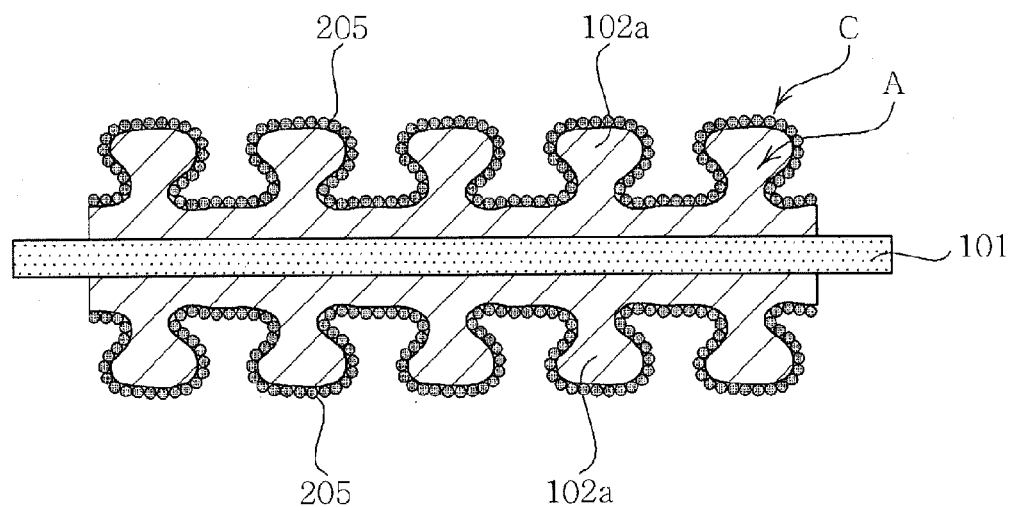
FIG. 12 is a schematic flow diagram illustrating a process of manufacturing a PCB according to the second preferred embodiment of the present invention.

As shown in FIG. 11, a second surface roughness having a black oxide layer 104 in a needle structure B is formed on the first surface roughness 102a during the black-oxide treatment process, and, as shown in FIG. 12, the needle structure B is converted into a granular structure C by treating the second surface roughness using an acidic dissolving agent during the post-dipping process, thus resulting in the black oxide layer 205 in the granular structure C and improving interlayer adhesion to a prepreg.

The acidic dissolving agent may contain an inorganic acid, an organic acid, an oxidizing agent, a persulfate compound, an azole compound, a chelate compound, a surfactant, and the like, alone or in combination thereof.

The inorganic acid may be selected from a group consisting of general inorganic acids such as sulfuric acid, nitric acid, phosphoric acid, hydrochloric acid, fluoric acid, boric acid, carboxylic acid, and the like, and mixtures thereof.

The organic acid may be selected from a group consisting of general organic acids such as glyceric acid, glutaric acid, citric acid, salicyclic acid, adipic acid, ascorbic acid, oxalic acid, maleic acid, malic acid, malonic acid, succinic acid, benzoic acid, glycolic acid, heptanoic acid, tartaric acid, lactic acid, formic acid, propionic acid, acrylic acid, acetic acid, butyric acid, valeric acid, 2-methylbutyric acid, n-hexanoic acid, 3,3-dimethyl butyric acid, 2-ethyl butyric acid, 4-methyl pentanoic acid, n-heptanoic acid, 2-methyl hexanoic acid, n-octanoic acid, 2-ethyl hexanoic acid, pimellic acid, phthalic acid, and the like, and mixtures thereof.

The oxidizing agent may be selected from a group consisting of general oxidizing agents such as hydrogen peroxide, urea hydrogen peroxide, percarbonate, benzoyl peroxide, peracetic acid, di-t-butyl peroxide, persulfate, sodium peroxide, periodic acid, periodate, perboric acid, perborate, permanganic acid, permanganate, iodic acid, iodate, cerium ammonium nitrate, ferric nitrate, and the like, or mixtures thereof.

The persulfate compound may be selected from sodium persulfate, potassium persulfate, ammonium persulfate, potassium monosulfate peroxide, and the like.

The azole compound may include, for example, imidazole, thiazole, triazole and/or tetrazole compounds, which are used alone or in combination of two or more thereof.

The chelate compound may be selected from a group consisting of, for example, iminodiacetate, acetylacetonate, 1,2-cyclohexanediamine-N,N,N'N'-tetraacetic acid, triethylamine, triethanolamine, ethylamine, methylamine, isobutylamine, tert-butylamine, tributylamine, dipropylamine, dimethylamine, ethylenediamine tetraacetic acid, hydroxyethyl ethylenediamine triacetic acid diglycolamine, monoethanolamine, methyldiethanolamine, aniline, Rochelle salt, Quadrol, organic phosphate, aminocarboxylic acid, diethylenetriamine pentaacetic acid, nitriloacetic acid, phosphoric acid, ethylenediamine tetramethylene phosphoric acid, diethylenetriamine pentamethylene phosphoric acid, nitrilotrimethylene phosphoric acid, polycarboxylic acid, Blue cornate, citrate, polyacrylate, polyaspartate, and the like.

The surfactant may be selected from a group consisting of cationic, amphoteric, anionic and/or non-ionic surfactants, or mixtures thereof.

As described above, a method for manufacturing a PCB according to the present invention may be employed in a wide range of applications including, for example, high reliability products as well as general products. Therefore, the inventive method is suitable for a wide range of processes for treatment of products. Moreover, the present invention may be employed in both a vertical process and a horizontal process generally used in the art.

As further shown in FIG. 11, it was found that the inventive method attains improved interlayer adhesion to various interlayer bonding resins having different characteristics such as normal Tg, middle Tg, high Tg, low Dk, low Df and/or halogen-free properties. For instance, even when using a BT resin layer 106 with a low Dk and a low impregnation rate due to a high Tg, as a prepreg, excellent effects such as high interlayer adhesion may be obtained.

In addition, since a complex surface roughness is formed in a two-stage process, a thickness of a black oxide layer formed during black-oxide treatment which is a process of forming a second surface roughness, may be decreased. Accordingly, the present invention may solve a problem in that a black oxide layer in a needle form is crushed by a driven roller during a horizontal process which in turn generates roll marks, if the black oxide layer is thick.

Hereinafter, the present invention will be described in detail by comparing the inventive examples with a comparative example, however, the scope of the present invention is not particularly limited thereto.

Example 1

According to a process sequence illustrated in FIG. 6, surface treatment of a circuit metal for a PCB was performed.

A degreasing process was conducted by treating a test specimen made of a copper clad laminate (CCL; 406 mm×510 mm, 0.1 mm in thickness) and a copper foil (330 mm×400 mm, 35 μm in thickness) using a solution of 20 wt. % MC100 (KENSCO Co., a basic cleaner) in deionized water at 60° C. for 1 minute and then washing the same.

After the degreasing process, an etching process was conducted by treating the test substrate, that is, the specimen (made of CCL and Cu foil) in an etching solution comprising 12 wt. % of sodium persulfate, 5 wt. % of sulfuric acid and 15 wt. % of BF200A (KENSCO Co., a roughness forming etchant) and the remainder of deionized water at room temperature for 1 minutes and then washing the same.

After the etching process, a pre-dipping process was conducted by treating the etched specimen using a solution of 30 wt. % BF300A (KENSCO Co., a metal surface-activating agent) in deionized water at room temperature for 1 minute.

Next, a black-oxide treatment process was conducted by treating the pre-dipped specimen using a mixture comprising 55 wt. % of BF400A (KENSCO Co., an oxidizing agent) and 25 w. % of BF400B (KENSCO Co., a base) in deionized water at 80° C. for 1 minute, so as to form a black oxide layer.

Thereafter, a post-dipping process was conducted by treating the black-oxide treated specimen using a reducing solution comprising 20 wt. % of BF500A (KENSCO Co., a reducing agent) and 10 wt. % of BF500B (KENSCO Co., a base) in deionized water at 45° C. for 1 minute.

Example 2

The present experiment was substantially performed according to the same procedures as described in Example 1, except that the post-dipping solution used herein was a dissolving solution comprising 40 wt. % of HR400A (KENSCO Co., a dissolving agent) and 10 wt. % of HR400B (KENSCO Co., a dissolving agent) in deionized water and the post-dipping process was conducted at 45° C. for 1 minute.

The black oxide layer of the specimen prepared according to the foregoing example had an average film thickness of 0.1 to 0.6 mg/cm$^2$.

Comparative Example 1

The present experiment was substantially performed according to the same procedures as described in Example 1, except that the etching process during black-oxide treatment was conducted using an etching solution comprising 12 wt. % sodium persulfate, 5 wt. % of sulfuric acid and the remainder of deionized water at room temperature for 1 minute, followed by washing, and the black-oxide treatment was conducted using a mixture comprising 55 wt. % of BF400A (KENSCO Co., an oxidizing agent), 25 wt. % of BF400B (KENSCO Co., a base) and the remainder of deionized water at 85° C. for 3 minutes, so as to form a black oxide layer.

Experimental Example

For assessment of reliability, a CCL specimen (406 mm×510 mm) with a predetermined thickness was firstly prepared, and weighed before and after formation of a black oxide layer thereon. Then, a difference in measured weights of the specimen was calculated to estimate a thickness of the black oxide layer. Alternatively, for determination of an etching rate, the CCL specimen (100 mm×100 mm) was cut into pieces having a predetermined size and each cut piece was weighed before and after the etching process. Then, a difference in measured weights of the specimen was calculated to determine the etching rate. For the inventive example, the thickness of the black oxide layer was constantly maintained in the range from 0.8 to 1.2 μm. Furthermore, interlayer adhesion between the Cu foil and resin was assessed by the following procedures. According to assessment items and procedures listed in Table 1, a prepreg (BT resin, GHPL-830, Tg=215° C.) and the treated Cu foil specimen (300 mm×400 mm, 35 μm in thickness) were stacked in this order above a bottom plate, followed by making the laminated specimen to a predetermined size (width: 10 mm) then etching the Cu foil. The remainder Cu foil was subjected to measurement of the peel strength using a tensile strength compressor. Measurement of roll marks was performed by processing a product in a horizontal black-oxide treatment line of the manufacturer after the foregoing treatments of the product.

TABLE 1

| Assessment Item | Assessment standard | Note |
| --- | --- | --- |
| Cu interlayer adhesion (peel strength) | More than 0.4 kgf/cm | Standard: Cu foil 35 μm According to prepreg cycle Manufacturing: According to press cycle |
| Analysis of roll marks | | Standard: 0.1 T,12/12 material |

Test results regarding interlayer adhesion, roll marks, and the like, as described in Examples 1 and 2 and Comparative Example, are shown in TABLE 2.

TABLE 2

| Section | Interface adhesion to BT resin (kgf/cm) | Roll mark |
| --- | --- | --- |
| Example 1 | 0.75 | Extremely less (excellent) |
| Example 2 | 0.68 | Less (good) |
| Comparative Example 1 | 0.15 | Numerous (fault, insufficient) |

From Table 2, it can be seen that Examples 1 and 2 achieved peel strengths of 0.75 and 0.69 kgf/cm, respectively, which are remarkably improved, as compared to Comparative Example 1. The reason for this excellent result is considered due to that a macro-anchor structure is impregnated with the BT resin, followed by permeation of the BT resin into a micro-needle structure of the black oxide layer, thereby increasing the interlayer adhesion between the Cu surface and the BT resin.

It was also found that roll marks are reduced in Examples 1 and 2, compared to Comparative Example 1. The reason for this result is considered due to that the present invention provides a complex surface roughness capable of decreasing a thickness of a black oxide layer, as compared to a conventional black-oxide treatment process, thereby reducing squashing (that is, dents) by a driven roller.

Consequently, a surface treatment method according to the present invention includes a process for formation of a first surface roughness that treats a surface of a metal circuit in a PCB with an etching solution for forming an anchor structure to form a surface roughness, and a process for activation of the surface of the metal circuit before black-oxide treatment thereof after formation of the first surface roughness. As a result, the anchor structure, that is, an alternative macro-surface roughness may be obtained, as compared to existing surface treatment of a Cu surface. Thereafter, this macro-surface roughness is subjected to a black-oxide treatment process, so as to form a second surface roughness in a needle structure. Because of this complex surface roughness, adhesive properties to a variety of interlayer bonding resins (that is, a prepreg) having specific characteristics such as high Tg, low Dk, low Df and/or halogen-free properties may be noticeably enhanced.

In addition, because of the complex surface roughness, a thickness of the black oxide layer may be relatively decreased, as compared to a conventional black-oxide treatment process. In particular, the present invention may control the thickness of the black oxide layer to a low level in the range of 0.1 to 0.6 mg/cm$^2$, thus sufficiently decreasing roll marks generated in a horizontal roll line. Moreover, a black-oxide treatment time may be reduced by 15 to 20 seconds than a conventional method, thereby enhancing production efficiency.

As described above, the present invention is preferably applicable to manufacturing of higher density, higher integration, ultra-thinner and high value-added products, which have recently been attracting attention in response to rapidly advancing trends in electronic technologies, and may provide a method for manufacturing a multilayer PCB satisfying the foregoing demands.

When the present invention is employed in manufacturing a product fabricated using a specific resin with high Tg, low Dk, low Df and/or halogen-free properties as a prepreg, improved adhesive properties unexpected by conventional arts may be achieved.

Moreover, the inventive method may solve a problem such as occurrence of numerous roll marks by a horizontal roll process during a conventional black-oxide treatment process, thereby producing improved PCBs suitable for application in a horizontal line. Furthermore, since an alternative apparatus is not required, the present invention may also have economic advantages.

Additionally, the inventive method may be employed in both a vertical line and a horizontal line generally used in the art, and may be widely used for manufacturing high reliability products as well as general products.

Although the preferred embodiments of the present invention have been disclosed for illustrative purposes, the printed circuit board (PCB) and the method for manufacturing the same according to the present invention are not limited thereto. Those skilled in the art will appreciate that various modifications, additions and substitutions are possible, without departing from the scope and spirit of the invention.

Accordingly, simple modifications and changes of the present invention should also be understood to fall within the present invention, the scope of which is defined in the appended claims and their equivalents.

What is claimed is:

1. A printed circuit board (PCB), comprising:
   a base substrate comprising a metal pattern for a circuit; and
   a surface roughness provided on the metal pattern,
   wherein the surface roughness has a first surface roughness in an anchor structure and a second surface roughness having a black oxide layer in a granular structure formed on the first surface roughness,
   wherein the anchor structure has a neck portion and a head portion having a larger surface area than the neck portion, and
   wherein a bismaleimide-triazine resin layer is formed on the black oxide layer in a granular structure that is formed on the anchor structure, and
   wherein an interlayer adhesion between the metal pattern and the bismaleimide-triazine resin layer is more than 0.4 kgf/cm.

2. The PCB as set forth in claim 1, wherein the black oxide layer has a thickness of 0.005 to 0.4 mg/cm2.

3. The PCB as set forth in claim 1, wherein a metal of the metal pattern for a circuit comprises Cu or a Cu alloy.

* * * * *